(12) United States Patent
Chang et al.

(10) Patent No.: US 7,633,482 B2
(45) Date of Patent: Dec. 15, 2009

(54) OPERATIONAL AMPLIFIER CIRCUIT HAVING DIGITALLY CONTROLLABLE OUTPUT STAGE

(75) Inventors: Yu-Jui Chang, Tai-Nan County (TW); Ying-Lieh Chen, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 963 days.

(21) Appl. No.: 11/160,038

(22) Filed: Jun. 6, 2005

(65) Prior Publication Data

US 2006/0274019 A1  Dec. 7, 2006

(51) Int. Cl.
*G09G 3/36* (2006.01)
(52) U.S. Cl. .................................... 345/100; 327/108
(58) Field of Classification Search ................ 330/255, 330/253, 262, 269
See application file for complete search history.

(56) References Cited

U.S. PATENT DOCUMENTS 6,710,617 B2   3/2004  Humphrey
7,075,342 B2 *  7/2006  Nishimura .................. 327/108

* cited by examiner

*Primary Examiner*—Robert Pascal
*Assistant Examiner*—Hieu P Nguyen
(74) *Attorney, Agent, or Firm*—Winston Hsu

(57) ABSTRACT

An operational amplifier circuit includes a control stage and an output stage. The control stage includes an analog control stage for generating a first control signal according to an input signal and a digital control stage for generating a second control signal according to the input signal. The output stage includes a sourcing circuitry coupled to the analog control stage and a load for sourcing a first current to the load according to the first control signal, and a sinking circuitry coupled to the digital control stage and the load for sinking a second current from the load according to the second control signal.

5 Claims, 3 Drawing Sheets

US 7,633,482 B2

1

OPERATIONAL AMPLIFIER CIRCUIT HAVING DIGITALLY CONTROLLABLE OUTPUT STAGE

BACKGROUND OF INVENTION

1. Field of the Invention

The present invention relates to an operational amplifier (op amp), and more particularly, to an operational amplifier circuit having a digitally controllable output stage.

2. Description of the Prior Art

The operational amplifier (op amp) is an essential circuit building block of universal importance. A reason for the popularity of the op amp is its versatility; a great amount of operations can be done with op amps. Normally, an operational amplifier circuit is used to drive a load according to an analog input signal. However, if a digital input signal is adopted, a digital-to-analog converter (DAC) must be set in the signal input end of the operational amplifier circuit to convert the digital input signal into an analog input signal. The operational amplifier circuit can then drive the load according to the analog input signal.

For instance, the liquid crystal display (LCD) source driver is a kind of device that needs to utilize an operational amplifier circuit including a DAC to drive a LCD display unit according to a digital input signal. FIG. 1 shows a schematic diagram of a conventional operational amplifier circuit 100 utilized in a LCD source driver. The operational amplifier circuit 100 shown in FIG. 1 includes a DAC 110, an analog control stage 120, and an output stage (which comprises five transistors $T_1 \sim T_5$). The LCD display unit driven by the operational amplifier circuit 100 is represented by a block "load 190" in FIG. 1.

The DAC 110 converts a digital input signal $S_{IN}$ of the LCD source driver into an analog input signal $S'_{IN}$. The analog control stage 120 then generates a control signal $V_C$ according to the analog input signal $S'_{IN}$. With the five transistors $T_1 \sim T_5$ of the output stage, currents are sourced to and sank from the load 190 according to the control signal $V_C$, the load 190 is therefore driven by the operational amplifier circuit 100 according to the digital input signal $S_{IN}$.

In the conventional operational amplifier circuit 100, gates of the second and fourth transistors $T_2$ and $T_4$ are coupled to a constant bias voltage $V_{BIAS}$, hence the two transistors can be thought of as constant current sinks for providing bias currents. After the operational amplifier circuit 100 is properly installed and supply voltages are provided to the operational amplifier circuit 100, power will be continually consumed by the second and fourth transistors $T_2$ and $T_4$. In practice, the operational amplifier circuit 100 is not always under operation, even if supply voltages are provided to the operational amplifier circuit 100 properly. For example, if no digital code is inputted into the operational amplifier circuit 100 as the digital input signal $S_{IN}$, the operational amplifier circuit 100 will not be under operation. However, when the operational amplifier circuit 100 is not under operation, power is still continually consumed by the second and fourth transistors $T_2$ and $T_4$. In other words, under the structure of the conventional operational amplifier circuit 100, some power is unnecessarily wasted.

SUMMARY OF INVENTION

One of many objectives of the claimed invention is to provide an operational amplifier circuit that reduces unnecessary power consumption.

2

According to the claimed invention, an operational amplifier circuit is disclosed. The operational amplifier circuit comprises a control stage and an output stage. The control stage includes an analog control stage for generating a first control signal according to an input signal and a digital control stage for generating a second control signal according to the input signal. The output stage includes a sourcing circuitry coupled to the analog control stage and a load for sourcing a first current to the load according to the first control signal, and a sinking circuitry coupled to the digital control stage and the load for sinking a second current from the load according to the second control signal.

According to the claimed invention, another operational amplifier circuit is disclosed. The operational amplifier circuit comprises a control stage and an output stage. The control stage includes an analog control stage for generating a first control signal according to an input signal and a digital control stage for generating a second control signal according to the input signal. The output stage includes a sinking circuitry coupled to the analog control stage and a load for sinking a first current from the load according to the first control signal, and a sourcing circuitry coupled to the digital control stage and the load for sourcing a second current to the load according to the second control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
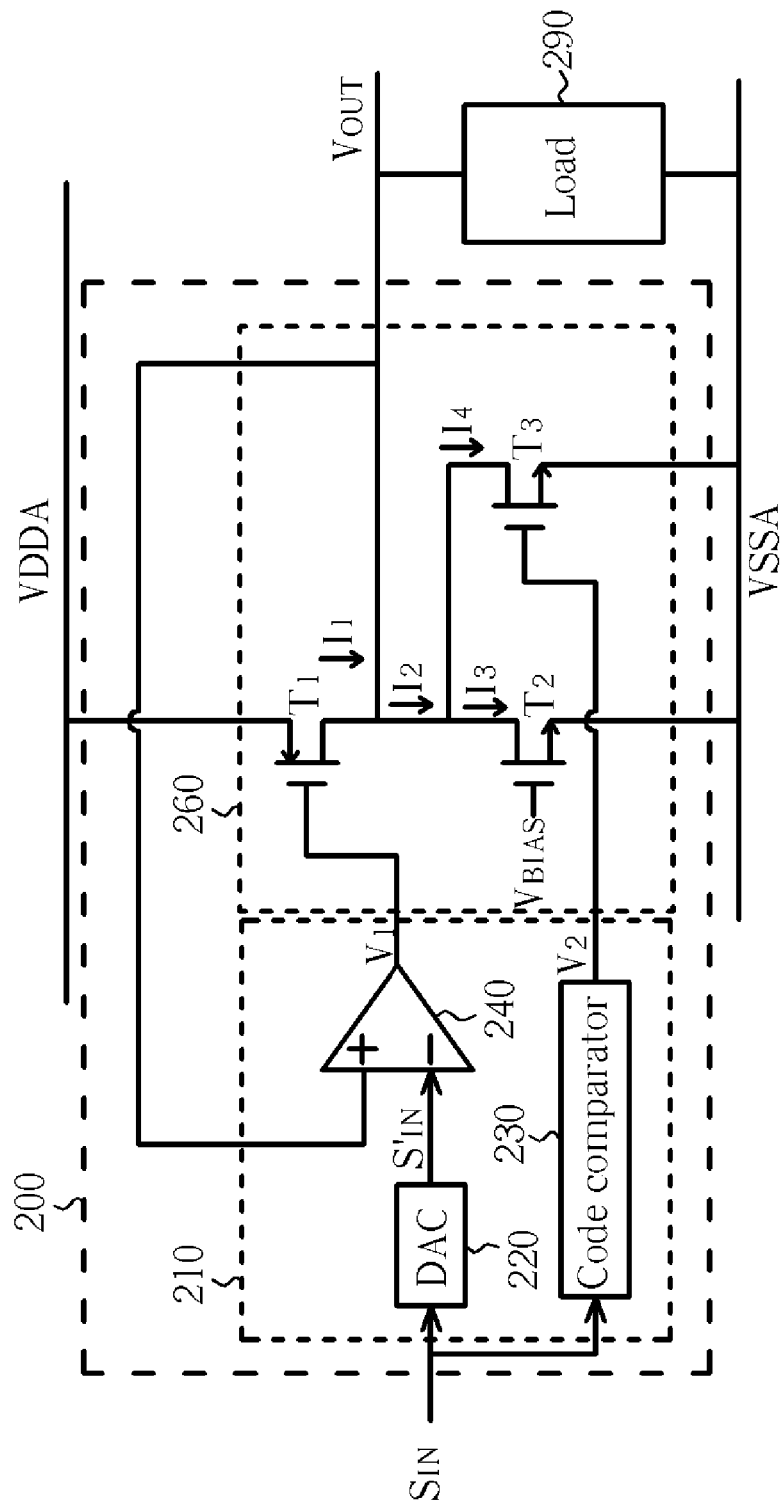
FIG. 2 shows a schematic diagram of an operational amplifier circuit according to the present invention.

Please refer to FIG. 2, which shows an operational amplifier circuit 200 according to a first embodiment of the present invention. In this embodiment, the operational amplifier circuit 200 is set inside a LCD source driver for driving a LCD display unit according to a digital input signal $S_{IN}$. The LCD display unit is represent by a block "load 290" in FIG. 2. In other embodiments, however, the operational amplifier circuit of the present invention can also be set in other kind of device for driving a load according to a digital input signal or an analog input signal.

The operational amplifier circuit 200 shown in FIG. 2 comprises a control stage 210 and an output stage 260. The control stage 210 includes a DAC 220, a code comparator 230, and an analog control stage 240. The DAC 220 converts the digital input signal $S_{IN}$ of the LCD source driver into an analog input signal $S'_{IN}$. The analog control stage 240 generates a first control signal $V_1$ according to the analog input signal $S'_{IN}$ received from the DAC 220. The first control signal $V_1$ is then utilized to control the value of a first current $I_1$ sourced to the load 290. The code comparator 230 serves as a digital control stage of the control stage 210. It compares a reference code with codes corresponding to the input signal $S_{IN}$ and generates a second control signal $V_2$ accordingly. The second control signal $V_2$ is then utilized to control the value of a second current $I_2$ sank from the load 290.

The output stage 260 comprises three transistors $T_1$~$T_3$. The first transistor $T_1$ serves as a sourcing circuitry of the output stage 260, which sources the first current $I_1$ to the load 290 according to the first control signal $V_1$. The second and third transistors $T_2$ and $T_3$ form a sinking circuitry of the output stage 260 for sinking the second current $I_2$ from the load 290 according to the second control signal $V_2$. In this embodiment, the second current $I_2$ sank by the sinking circuitry comprises a bias current $I_3$ provided by the second transistor $T_2$ and an adjustable current $I_4$ provided by the third transistor $T_3$. Since the gate of the second transistor $T_2$ is coupled to a bias voltage $V_{BIAS}$, it serves as a first current sink for sinking the constant bias current $I_3$ from the load 290. Since the gate of the third transistor $T_3$ is coupled to the code comparator 230 for receiving the second control signal $V_2$, it serves as a second current sink for sinking the adjustable current $I_4$ from the load 290 according to the second control signal $V_2$. In this embodiment, the third transistor $T_3$ is a NMOS transistor having a control terminal coupled to the code comparator 230 for receiving the second control signal $V_2$, a first terminal coupled to the load 290 for sinking the adjustable current $I_4$ from the load 290, and a second terminal coupled to a low bias voltage VSSA. In other embodiments, the third transistor $T_3$ can also be a PMOS transistor or other kind of transistor.

Figure 1:
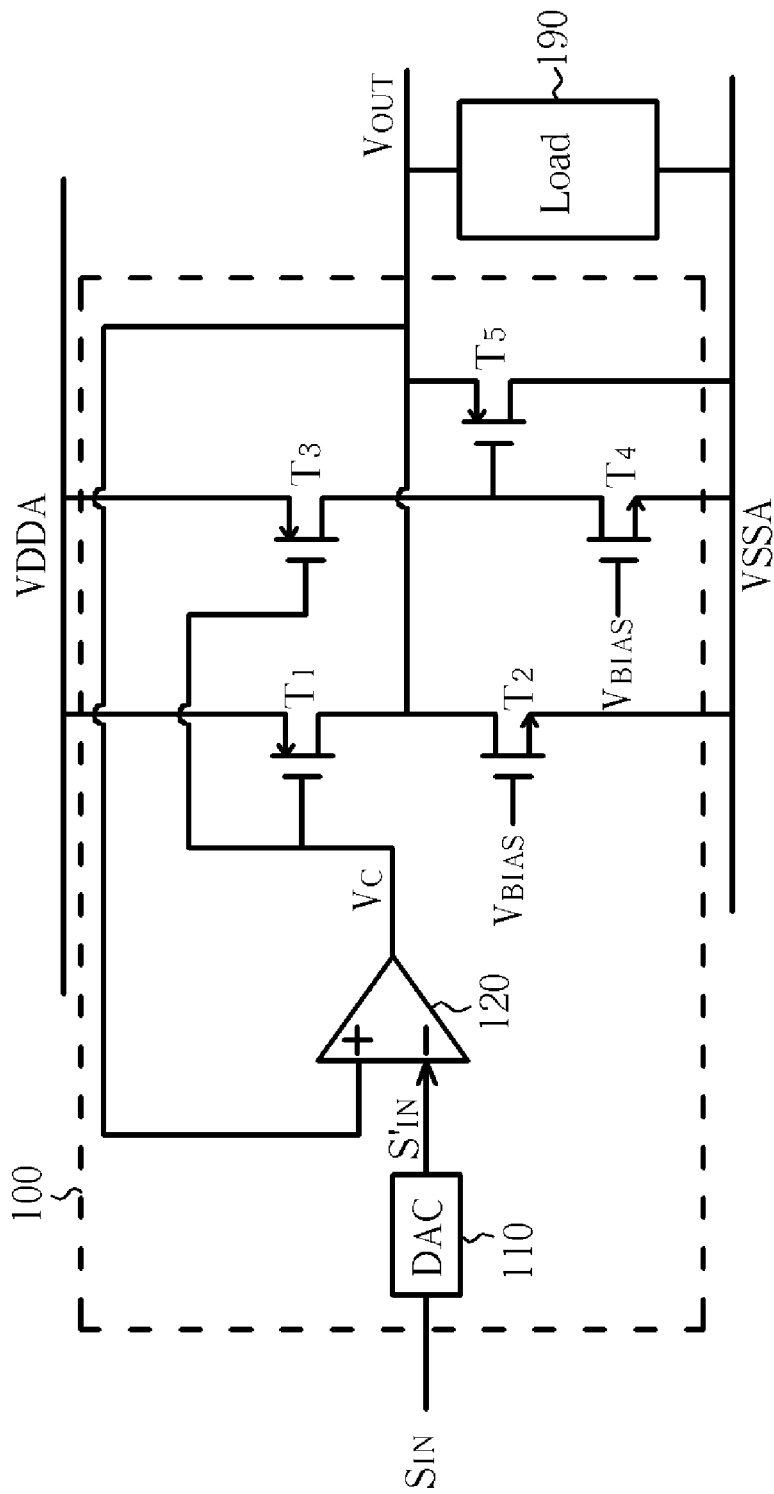
FIG. 1 shows a schematic diagram of a conventional operational amplifier circuit.

By comparing the reference code with codes of the input signal $S_{IN}$, the code comparator 230 can determine whether the level of the output voltage $V_{OUT}$ should be abated accordingly. When it is determined that the level of the output voltage $V_{OUT}$ should be abated, the code comparator 230 turns the third transistor $T_3$ on for a short period to increase the discharging speed of the output stage 260. When it is determined that the level of the output voltage $V_{OUT}$ should be raised or sustained, the code comparator 230 turns the third transistor $T_3$ off. With the idea of utilizing the code comparator 230 to control the second current sink formed by the third transistor $T_3$, a bias current path (such as the bias current path formed by the fourth transistor $T_4$ of FIG. 1) is excluded. Hence, with the digital control scheme, power will not be continually consumed by the third transistor $T_3$. When it is determined that the level of the output voltage $V_{OUT}$ should be raised or sustained, or when the operational amplifier circuit 200 is not under operation (ex. no code is inputted into the code comparator 230 as the digital input signal $S_{IN}$), power will not be consumed by the third transistor $T_3$. Therefore, unnecessary power consumption is reduced.

Figure 3:
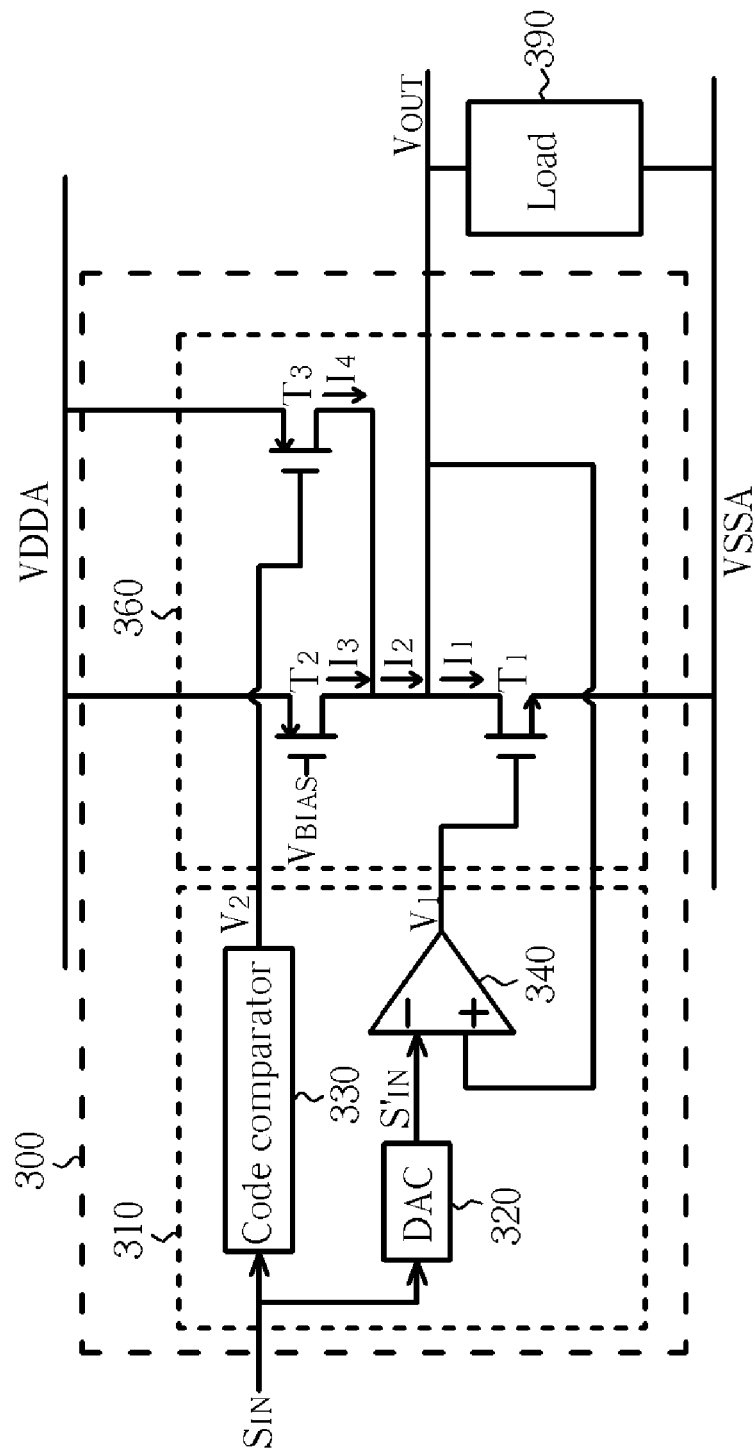
FIG. 3 shows a schematic diagram of another operational amplifier circuit according to the present invention.

In the above-mentioned embodiment, a digital control stage is used to control a sinking circuitry of an operational amplifier circuit. In other embodiments, a digital control stage can also be used to control a sourcing circuitry of an operational amplifier circuit. FIG. 3 shows an operational amplifier circuit 300 according to a second embodiment of the present invention. Similar to the operational amplifier circuit 200 of the first embodiment, the operational amplifier circuit 300 of the second embodiment is also set inside a LCD source driver for driving a LCD display unit according to a digital input signal $S_{IN}$. The LCD display unit is represent by a block "load 390" in FIG. 3. Please note that in other embodiments, the operational amplifier circuit of the present invention can also be set in other kind of device for driving a load according to a digital input signal or an analog input signal.

The operational amplifier circuit 300 shown in FIG. 3 comprises a control stage 310 and an output stage 360. The control stage 310 includes a DAC 320, a code comparator 330, and an analog control stage 340. The DAC 320 converts the digital input signal $S_{IN}$ of the LCD source driver into an analog input signal $S'_{IN}$. The analog control stage 340 generates a first control signal $V_1$ according to the analog input signal $S'_{IN}$ received from the DAC 220. The first control signal $V_1$ is then utilized to control the value of a first current $I_1$ sank from the load 390. The code comparator 330 serves as a digital control stage of the control stage 310. It compares a reference code with codes corresponding to the input signal $S_{IN}$ and generates a second control signal $V_2$ accordingly. The second control signal $V_2$ is then utilized to control the value of a second current $I_2$ sourced to the load 390.

The output stage 360 comprises three transistors $T_1$~$T_3$. The first transistor $T_1$ serves as a sinking circuitry of the output stage 360, which sinks the first current $I_1$ from the load 390 according to the first control signal $V_1$. The second and third transistors $T_2$ and $T_3$ form a sourcing circuitry of the output stage 360 for sourcing the second current $I_2$ to the load 390 according to the second control signal $V_2$. In this embodiment, the second current $I_2$ sourced from the sourcing circuitry includes a bias current $I_3$ provided by the second transistor $T_2$ and an adjustable current $I_4$ provided by the third transistor $T_3$. Since the gate of the second transistor $T_2$ is coupled to a bias voltage $V_{BIAS}$, it serves as a first current source for sourcing the constant bias current $I_3$ to the load 390. Since the gate of the third transistor $T_3$ is coupled to the code comparator 330 for receiving the second control signal $V_2$, it serves as a second current source for sourcing the adjustable current $I_4$ to the load 390 according to the second control signal $V_2$. In this embodiment, the third transistor $T_3$ is a PMOS transistor having a control terminal coupled to the code comparator 330 for receiving the second control signal $V_2$, a first terminal coupled to the load 390 for sourcing the adjustable current $I_4$ to the load 390, and a second terminal coupled to a high bias voltage VDDA. In other embodiments, the third transistor $T_3$ can also be a NMOS transistor or other kind of transistor.

By comparing the reference code with codes of the input signal $S_{IN}$, the code comparator 330 can determine whether the level of the output voltage $V_{OUT}$ should be raised. When it is determined that the level of the output voltage $V_{OUT}$ should be raised, the code comparator 330 turns the third transistor $T_3$ on for a short period to increase the charging speed of the output stage 360. When it is determined that the level of the output voltage $V_{OUT}$ should be abated or sustained, the code comparator 330 turns the third transistor $T_3$ off. With the idea of utilizing the code comparator 330 to control the second current source formed by the third transistor $T_3$, a bias current path is excluded. Hence, with the digital control scheme, power will not be continually consumed by the third transistor $T_3$. When it is determined that the level of the output voltage $V_{OUT}$ should be abated or sustained, or when the operational amplifier circuit 300 is not under operation (ex. no code is inputted into the code comparator 330 as the digital input signal $S_{IN}$), power will not be consumed by the third transistor $T_3$. Therefore, unnecessary power consumption is reduced.

In contrast to conventional operational amplifier circuits, the operational amplifier circuits disclosed by the embodiments of the present invention have digitally controllable output stages. Fewer bias current paths are required; hence, the operational amplifier circuits disclosed by the embodiments of the present invention will consume less power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operational amplifier circuit comprising:
   a control stage comprising:
      an analog control stage for generating a first control signal according to an input signal; and
      a digital control stage for generating a second control signal according to the input signal; and
   an output stage comprising:
      a sourcing circuitry coupled to the analog control stage and a load, for sourcing a first current to the load according to the first control signal; and
      a sinking circuitry coupled to the digital control stage and the load, for sinking a second current from the load according to the second control signal, comprising:
         a first current sink coupled to the load for sinking a bias current from the load; and
         a second current sink coupled to the digital control stage and the load for sinking an adjustable current from the load according to the second control signal, wherein the second current comprises the bias current and the adjustable current.

2. The operational amplifier circuit of claim 1, wherein the digital control stage comprises a code comparator for comparing a reference code with codes corresponding to the input signal and generating the second control signal accordingly.

3. The operational amplifier circuit of claim 1, wherein the input signal is a digital input signal, the control stage further comprises a digital to analog converter (DAC) coupled to the analog control stage for converting the digital input signal into an analog input signal, and the analog control stage generates the first control signal according to the analog input signal received from the DAC.

4. The operational amplifier circuit of claim 1, wherein the second current sink comprises a transistor having a control terminal coupled to the digital control stage for receiving the second control signal, a first terminal coupled to the load for sinking the adjustable current from the load, and a second terminal coupled to a low bias voltage.

5. The operational amplifier circuit of claim 1, wherein the operational amplifier circuit is set inside a liquid crystal display (LCD) source driver for driving the load according to the input signal, and the load is a LCD display unit.

* * * * *